United States Patent
Schiffer et al.

(10) Patent No.: US 9,506,831 B2
(45) Date of Patent: Nov. 29, 2016

(54) MICROMECHANICAL MEASURING ELEMENT AND METHOD FOR PRODUCING A MICROMECHANICAL MEASURING ELEMENT

(71) Applicant: EPCOS AG, Munich (DE)

(72) Inventors: Michael Schiffer, Berlin (DE); Andreas Peschka, Michendorf (DE); Jörg Zapf, Munich (DE); Karl Weidner, Munich (DE); Harry Hedler, Germering (DE)

(73) Assignee: EPCOS AG, Munich (DE)

( * ) Notice: Subject to any disclaimer, the term of this patent is extended or adjusted under 35 U.S.C. 154(b) by 74 days.

(21) Appl. No.: 14/383,857

(22) PCT Filed: Mar. 8, 2013

(86) PCT No.: PCT/EP2013/054725
§ 371 (c)(1),
(2) Date: Sep. 8, 2014

(87) PCT Pub. No.: WO2013/132065
PCT Pub. Date: Sep. 12, 2013

(65) Prior Publication Data
US 2015/0027224 A1  Jan. 29, 2015

(30) Foreign Application Priority Data
Mar. 9, 2012  (DE) .................. 10 2012 102 021

(51) Int. Cl.
*G01D 11/24* (2006.01)
*G01L 19/14* (2006.01)
(Continued)

(52) U.S. Cl.
CPC ............. *G01L 19/14* (2013.01); *B23K 1/0008* (2013.01); *B23K 1/0016* (2013.01); *B81B 7/007* (2013.01);
(Continued)

(58) Field of Classification Search
CPC ............................ G01D 11/24; G01D 11/245
USPC .......................................................... 73/431
See application file for complete search history.

(56) References Cited

U.S. PATENT DOCUMENTS 4,773,269 A      9/1988  Knecht et al.
5,329,423 A  *  7/1994  Scholz ................... H01L 23/32
                                                                 174/263

(Continued)

FOREIGN PATENT DOCUMENTS

DE         19826426 A1    12/1999
DE      102005053876 A1    5/2007
(Continued)

OTHER PUBLICATIONS

"K-Series STARe A/G—Pressure Sensor Module: Absolute and Gauge Measurements," First Sensor Technology GmbH, Rev. 01, Nov. 2010, 4 pages.
(Continued)

*Primary Examiner* — Michael A Lyons
*Assistant Examiner* — Jamel Williams
(74) *Attorney, Agent, or Firm* — Slater Matsil, LLP

(57) ABSTRACT

A micromechanical measuring element includes a carrier and a sensitive element connected to the carrier by a first solder connection and a second solder connection. The sensitive element is contacted electrically by the first solder connection. The sensitive element, the carrier and the second solder connection form a first chamber. The first chamber has a first opening.

15 Claims, 2 Drawing Sheets

(51) Int. Cl.
*B81B 7/00* (2006.01)
*B23K 1/00* (2006.01)
*G01P 1/02* (2006.01)

(52) U.S. Cl.
CPC ........... *G01D 11/245* (2013.01); *G01L 19/147* (2013.01); *G01L 19/148* (2013.01); *G01P 1/023* (2013.01); *B81B 2207/092* (2013.01); *B81B 2207/096* (2013.01)

(56) References Cited

U.S. PATENT DOCUMENTS

| | | | | |
|---|---|---|---|---|
| 5,468,995 | A * | 11/1995 | Higgins, III | H05K 3/3436 257/697 |
| 5,600,071 | A | 2/1997 | Sooriakumar et al. | |
| 5,611,884 | A * | 3/1997 | Bearinger | C09J 183/04 156/325 |
| 5,640,052 | A * | 6/1997 | Tsukamoto | H01L 24/81 257/738 |
| 6,049,128 | A | 4/2000 | Kitano et al. | |
| 6,107,180 | A * | 8/2000 | Munroe | H01L 24/03 257/E21.508 |
| 6,229,190 | B1 | 5/2001 | Bryzek et al. | |
| 6,642,136 | B1 * | 11/2003 | Lee | H01L 21/563 257/E21.503 |
| 6,686,664 | B2 * | 2/2004 | Caletka | B23K 3/0623 257/772 |
| 6,987,312 | B2 * | 1/2006 | Theuss | B81B 7/0077 257/680 |
| 7,644,625 | B2 | 1/2010 | Ricks | |
| 7,667,473 | B1 * | 2/2010 | Conn | H01L 21/563 257/738 |
| 8,215,176 | B2 | 7/2012 | Ding et al. | |
| 8,531,018 | B2 * | 9/2013 | Pahl | B81B 7/0048 257/678 |
| 2005/0189622 | A1 | 9/2005 | Humpston et al. | |
| 2005/0248422 | A1 * | 11/2005 | Joodaki | H01P 11/003 333/246 |
| 2006/0202352 | A1 * | 9/2006 | Li | C23C 14/165 257/779 |
| 2007/0069000 | A1 * | 3/2007 | Schubert | B23K 35/3613 228/246 |
| 2009/0115430 | A1 * | 5/2009 | Fang | G01L 9/0073 324/686 |
| 2011/0165717 | A1 | 7/2011 | Lee et al. | |
| 2011/0298064 | A1 * | 12/2011 | Pahl | B81B 7/0048 257/415 |

FOREIGN PATENT DOCUMENTS

| | | | | |
|---|---|---|---|---|
| DE | 102010028305 | A1 | | 8/2011 |
| DE | 102010012042 | A1 * | 9/2011 | ........... B81B 7/0048 |
| DE | 102014106220 | A1 * | 11/2015 | ............. H01L 24/73 |
| DE | 102014106503 | A1 * | 11/2015 | ......... B81C 1/00134 |
| DE | 102014008839 | A1 * | 12/2015 | ............. H01L 24/73 |
| JP | 6167842 | A | | 4/1986 |
| JP | 62180738 | U | | 11/1987 |
| JP | 6365332 | A | | 3/1988 |
| JP | 1503326 | A | | 11/1989 |
| JP | 51962 | A | | 1/1993 |
| JP | 888457 | A | | 4/1996 |
| JP | 9126920 | A | | 5/1997 |
| JP | 9126927 | A | | 5/1997 |
| JP | 9260533 | A | | 10/1997 |
| JP | 2000340692 | A * | | 12/2000 |
| JP | 2007248212 | A | | 9/2007 |
| JP | 2007309914 | A | | 11/2007 |
| WO | 03067657 | A2 | | 8/2003 |
| WO | WO 2014029602 | A1 * | 2/2014 | ........... H05K 1/0306 |

OTHER PUBLICATIONS

"K-Series STARe D—Pressure Sensor Module: Differential Measurements," First Sensor Technology GmbH, Rev. 01, Nov. 2010, 4 pages.

"Parylene," Wikipedia, Jan. 12, 2012, 7 pages.

Beeby, S., et al., "MEMS Mechanical Sensor Package," MEMS Mechanical Sensor, Artech House, Inc., Jan. 1, 2004, pp. 71-81.

"Pressure Sensors—Barometric pressure transducer for SMT (ASB 1200 E)," EPCOS AG, Aug. 3, 2009, 8 pages.

Gerlach, G., et al., "50 Jahre Entdeckung des piezoresistiven Effkts—Geschichte und Entwicklungs—stand piezoresistiver Sensoren (50 Years of Piezoresistive Sensors—History and State of the Art of Piezoresistive Sensors)," Technisches Messen, vol. 72, No. 2, Feb. 2005, pp. 53-76. (partial translation).

* cited by examiner

MICROMECHANICAL MEASURING ELEMENT AND METHOD FOR PRODUCING A MICROMECHANICAL MEASURING ELEMENT

This patent application is a national phase filing under section 371 of PCT/EP2013/054725, filed Mar. 8, 2013, which claims the priority of German patent application 10 2012 102 021.3, filed Mar. 9, 2012, each of which is incorporated herein by reference in its entirety.

TECHNICAL FIELD

A micromechanical measuring element is described. In addition, a method for producing a micromechanical measuring element is described.

BACKGROUND

Electromechanical measuring elements which are realized, for example, as pressure sensors, such as, for example, absolute pressure sensors or relative or differential pressure sensors, are known at least in-house. The pressure sensors have a sensitive element which is mounted on a chip accommodating means, for example, by a jointing medium, for example, by an adhesive or a solder connection. The sensitive element can have, for example, piezo-resistors, the electric output signals of which are guided to outside contacts of the pressure sensor by wire bonding. Depending on the application, the pressure sensor can have a housing cover which is provided with a media supplying means. In the case of known pressure sensors, the supplying of the media, for example, by mounting the sensitive element, and the contacting of the pressure sensor electrically, for example, by wire bonding, are carried out in separate process steps.

SUMMARY OF THE INVENTION

At least some embodiments provide a micromechanical measuring element which is simple to produce. At least some further embodiments provide a method for producing a micromechanical measuring element.

A micromechanical measuring element according to at least one embodiment has a sensitive element and a carrier. The carrier can have, for example, a ceramic material or can be realized as a ceramic plate. In addition, it is possible for the carrier to be realized as a printed circuit board, for example, as an FR4 printed circuit board. The sensitive element preferably has silicon or consists substantially thereof. For example, the sensitive element can be realized as a silicon chip. Preferably, the sensitive element is connected to the carrier by at least one first and at least one second solder connection. For example, the sensitive element can be directly connected to the carrier by the at least one first and the at least one second solder connection. The sensitive element is preferably contacted electrically by the first solder connection.

According to a further development, the sensitive element, the carrier and the second solder connection form a first chamber. The first chamber preferably has a first opening. In addition, it is possible for the first chamber to be formed by the sensitive element, the carrier, the second solder connection and further components. The further components can be, for example, elastomer bodies and/or metallizations which are arranged between the sensitive element and the second solder connection and/or between the second solder connection and the carrier.

According to a further development, the first opening of the first chamber is realized in such a manner that a first medium can be supplied to the first chamber. The sensitive element preferably has a membrane with a bottom side and with a top side. The sensitive element can be, for example, a silicon chip produced from a silicon wafer having a membrane, the membrane forming a thinned region, for example, a thinly etched region of the silicon chip. By the first opening, the top side of the membrane can be accessible to the first medium, which can also be designated here and below as a measuring medium or as a transferring medium. The measuring medium can transfer an admitted pressure onto the membrane of the sensitive element, as a result of which pressure determining is able to be made possible. For example, the sensitive element is realized as a piezo-resistive element which has piezo-resistor structures, supply lines and contacting faces. By deforming the membrane and the piezo-resistor structures implanted therein in a pressure-dependent manner, said piezo-resistor structures being, for example, connected to a Wheatstone bridge, the change in resistance of the piezo-resistor structures can lead to the change in the electrical output voltage of the Wheatstone bridge, by which the admitted pressure or a change in pressure can be determined. As an alternative to this, the sensitive element can also be realized as a capacitive or piezo-electric element.

During the production of a micromechanical measuring element described here, electric and fluidic connections can be advantageously realized in one simultaneous process step. In addition, it can be ensured that the fluidic connections are separate from the electric connections.

According to a further development, the sensitive element is arranged on a substrate. The substrate can have, for example, glass and/or silicon or can consist of one of said materials.

According to a further development, the micromechanical measuring element has a cap which is directly connected to the carrier. The cap preferably surrounds the substrate and the sensitive element mounted on the substrate, at least in part. For example, the cap and the substrate connected to the substrate can encase the sensitive element and the substrate. The cap preferably has silicon, a ceramic material or a plastics material or consists of one of said materials. According to a preferred further development, the carrier is realized as an FR4 printed circuit board and the cap is realized in plastics material.

According to a further development, the first opening is realized in the carrier. The carrier can have, for example, a bore which forms the first opening of the first chamber and provides the first medium with access to the top side of the membrane.

According to a further development, the second solder connection is realized so as to be ring-shaped. The first chamber is preferably hermetically sealed by the second, ring-shaped solder connection such that the first opening forms the single opening of the first chamber.

According to a further development, an elastomer body is arranged in each case between the sensitive element and the solder connection and between the sensitive element and the second solder connection. The elastomer bodies can be applied, for example, by inkjet technology, by screen printing or as a laminated film, for example, by structuring by lithography or laser ablation. The elastomer bodies arranged between the solder connections and the sensitive element can ensure mechanical decoupling between the carrier and the sensitive element and in this way ensure that parasitic induction, for example, that caused by the packaging, is minimized.

According to a further development, metallization is arranged between the elastomer bodies and the first solder connection. The metallization is preferably realized in a meandering or helical manner. As a result, flexibility necessary during mechanically and/or thermally induced stresses can be achieved in an advantageous manner. The metallization can preferably be soldered. For example, the metallization can be generated by sputtering a seed-layer and subsequent electrolytic deposition on the elastomer.

According to a further development, the first chamber is provided at least in part with a protective layer. As a result, it can be ensured in an advantageous manner that even moist and/or corrosive media can be used as the first and/or second medium.

According to a further development, the protective layer comprises parylene. In an advantageous manner, all regions or parts of the micromechanical measuring element exposed to the first and/or second medium are coated with parylene.

According to a further development, the sensitive element is connected directly to a substrate on a side remote from the carrier. A second chamber is preferably formed at least in part by the sensitive element and the substrate. The second chamber preferably has a second opening which extends through the carrier and the sensitive element.

According to a further development, the bottom side of the membrane is accessible to a second medium by the second opening. The achievement here is that a reference pressure can be transferred to the membrane by the second medium.

According to a further development, the micromechanical measuring element is realized as a pressure sensor. The pressure sensor can be realized, for example, as an absolute pressure sensor, as a relative pressure sensor or as a differential pressure sensor.

According to a further development, the micromechanical measuring element is realized as a gas sensor. In an advantageous manner, the gas sensor is suitable for detecting gaseous substances, chemical information in the air surrounding the gas sensor being converted into an electrically useful signal.

According to a further development, the micromechanical measuring element is realized as an acceleration sensor. The acceleration sensor can be realized, for example, as a miniaturized sensor, for example, as a piezo-electric sensor or as a so-called MEMS (Micro-Electro-Mechanical system).

In addition, a method for producing a micromechanical measuring element is provided. The micromechanical measuring element produced or producible as a result of said method can have one or several features of the aforementioned embodiments. The embodiments described beforehand and below are equally applicable both to the micromechanical measuring element and to the method for producing the micromechanical measuring element.

According to one embodiment a sensitive element is provided. In addition, a carrier is provided which has at least one first opening. The carrier preferably has at least one feedthrough which serves for contacting the sensitive element. The sensitive element is then connected to the carrier. The sensitive element is preferably connected to the carrier by one or several solder connections, at least one of the solder connections connecting the sensitive element to the feedthrough in an electrically conducting manner. The one or several solder connections can be imprinted, for example, by a solder paste. As an alternative to this, the one or several solder connections can also be applied by sputtering or electrolytic deposition. The sensitive element is contacted electrically and media is supplied to the sensitive element in one process step by connecting the sensitive element to the carrier.

According to a further development, the sensitive element is connected to the carrier by flip-chip soldering.

The production processes take place both at the wafer level and in the subsequent packaging process steps as the used batch processes and are thus advantageously realizable in a cost efficient manner. In addition, the production technology offers great potential with regard to the miniaturization of the entire housing and can be used as a fundamental technology for a wide product spectrum.

BRIEF DESCRIPTION OF THE DRAWINGS

Exemplary embodiments of micromechanical measuring elements and of methods for producing a micromechanical measuring element are explained below with reference to FIGS. 1 to 4.

Identical or identically acting components in the exemplary embodiments and Figures can be provided in each case with the identical references. The elements shown and the dimension ratios thereof together are basically not seen as true to scale. Rather, individual elements such as, for example, layers, components and regions are shown in an exaggeratedly thick or over-dimensioned manner so as to be better depicted and/or better understood.

DETAILED DESCRIPTION OF ILLUSTRATIVE EMBODIMENTS

Figure 1:
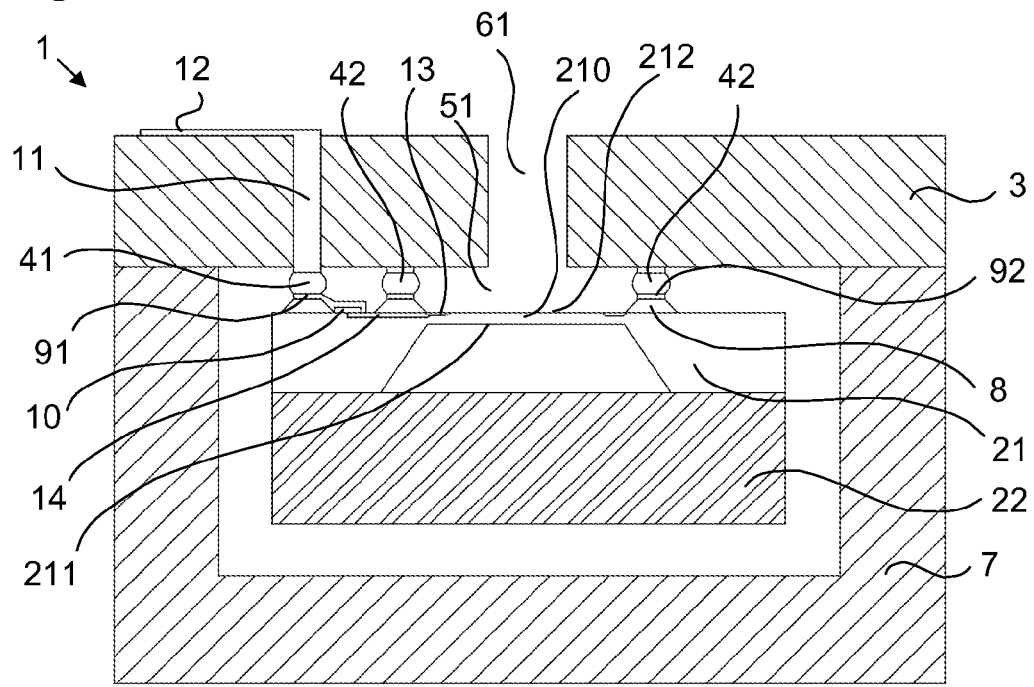
FIG. 1 shows a schematic sectioned view of a micromechanical measuring element according to a first exemplary embodiment.

FIG. 1 shows a schematic sectioned representation of a micromechanical measuring element 1. The micromechanical measuring element 1 is realized as an absolute pressure sensor with front-side media supply.

The micromechanical measuring element 1 has a sensitive element 21 and a carrier 3. The carrier 3 is a ceramic plate in the exemplary embodiment shown. As an alternative to this, the carrier 3 can also be realized as an FR4 printed circuit board. The sensitive element 21 is realized as a piezo-resistive MEMS pressure sensor chip and has a membrane 210 with a bottom side 211 and a top side 212.

In addition, the sensitive element 21 is directly connected to a substrate 22 of glass. As an alternative to this, the substrate 22 can also have silicon or consist of silicon. The sensitive element 21 is connected to the carrier 3 on a side remote from the substrate 22 by a first solder connection 41 and a second solder connection 42. An outside contact 12, which is mounted on the carrier 3 and serves for contacting the measuring element 1 electrically from the outside, is connected by a feedthrough 11 to the first solder connection 41 so as to be electrically conducting. Consequently, the first solder connection 41 serves for contacting the sensitive element 21 electrically. As an alternative to this, the micromechanical measuring element 1 can also have one or several further first solder connections 41 which connect the sensitive element 21 to further feedthroughs 11 in the carrier 3 so as to be electrically conducting.

The sensitive element, the carrier and the second solder connection 42, which is realized in a ring-shaped manner, form a first chamber 51. The first chamber 51 has a first opening 61 which is realized in the carrier 3 and serves for supplying a first medium. The first chamber 51 is sealed off so as to be pressure-tight by the ring-shaped second solder connection 42.

An elastomer body 8, which serves for the mechanical decoupling between the carrier and the sensitive element, is arranged in each case between the solder connections 41, 42 and the sensitive element. In addition, a metallization 92 is arranged in each case between the second, ring-shaped solder connection 42 and the elastomer body and between the second solder connection 42 and the carrier 3. A metallization 91, which is realized in a meander-shaped manner, is also arranged between the first solder connection 41 and the elastomer body 8. As an alternative to this, the metallization 91 can also be realized in a helical manner. In an advantageous manner the meander-shaped or helically formed metallization 91 is able to compensate for an effect of mechanical stresses.

A pressure to be measured is transferred to the membrane 210 by the first medium, a deformation of the membrane 210 resulting therefrom produced by implanted resistance structures 13, which are realized as piezo-resistors, being detected. A resultant electric signal is supplied to the outside contact 12 by highly doped supply lines 14, an aluminum contact pad 10, the metallization 91 deposited on the elastomer body 8, the first solder connection 41 and the feedthrough 11. The resistance structures 13 and supply lines 14 form a piezo-resistive measuring bridge for pressure measuring. In addition, it is possible for the measuring bridge to be formed by further functional layers.

The first chamber 15 is provided at least in part with a protective layer of parylene. A high level of corrosion resistance against a plurality of media can be ensured by the coating with the protective layer. For example, even moist and corrosive media can be used as a result.

In addition, the micromechanical measuring element 1 has a cap 7 of silicon which is directly connected to the carrier 3. As an alternative to this, the cap can also have a plastics material or a ceramic material. In addition, it is possible for the micromechanical measuring element 1 to be realized without a cap 7.

Figure 2:
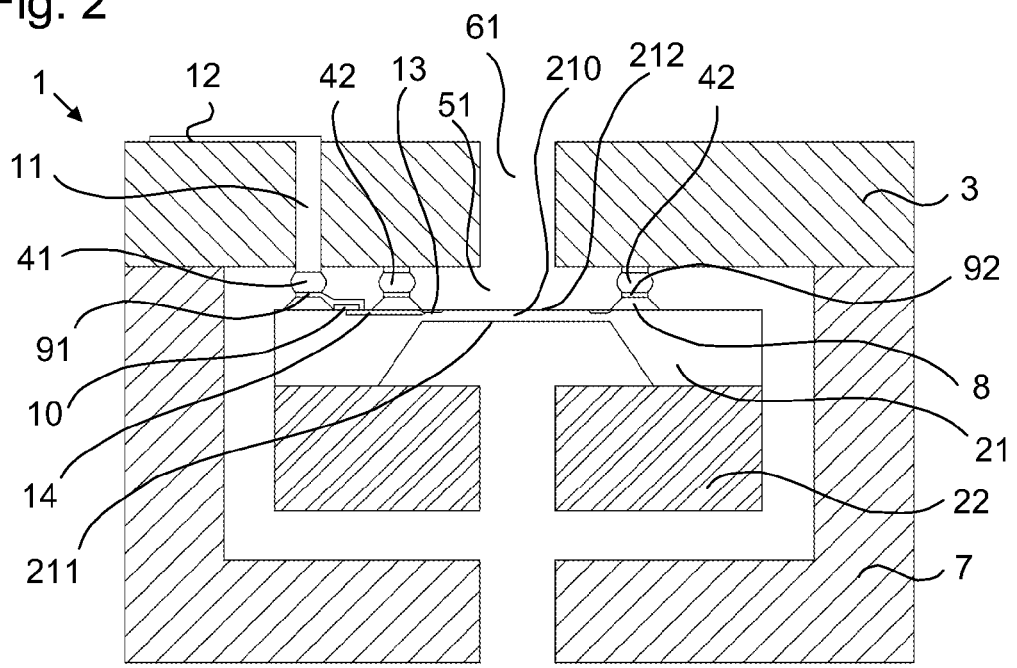
FIG. 2 shows a schematic sectioned view of a micromechanical measuring element according to a further exemplary embodiment.

FIG. 2 shows a sectioned view of a micromechanical measuring element 1 according to a further exemplary embodiment.

Contrary to the exemplary embodiment according to FIG. 1, the cap 7 and the substrate 22 have, in each case, an opening on a side that faces the bottom side 211 of the membrane 210. A second medium is able to be supplied to the bottom side 211 of the membrane 210 by the openings in the cap 7 and in the substrate 22. Consequently, the micromechanical measuring element 1 shown in FIG. 2 has media supplying means on the front and rear side and, as a result, is able to be used as a relative or differential pressure sensor. It is possible to dispense with the cap 7 if the relative pressure corresponds to the ambient pressure.

Figure 3:
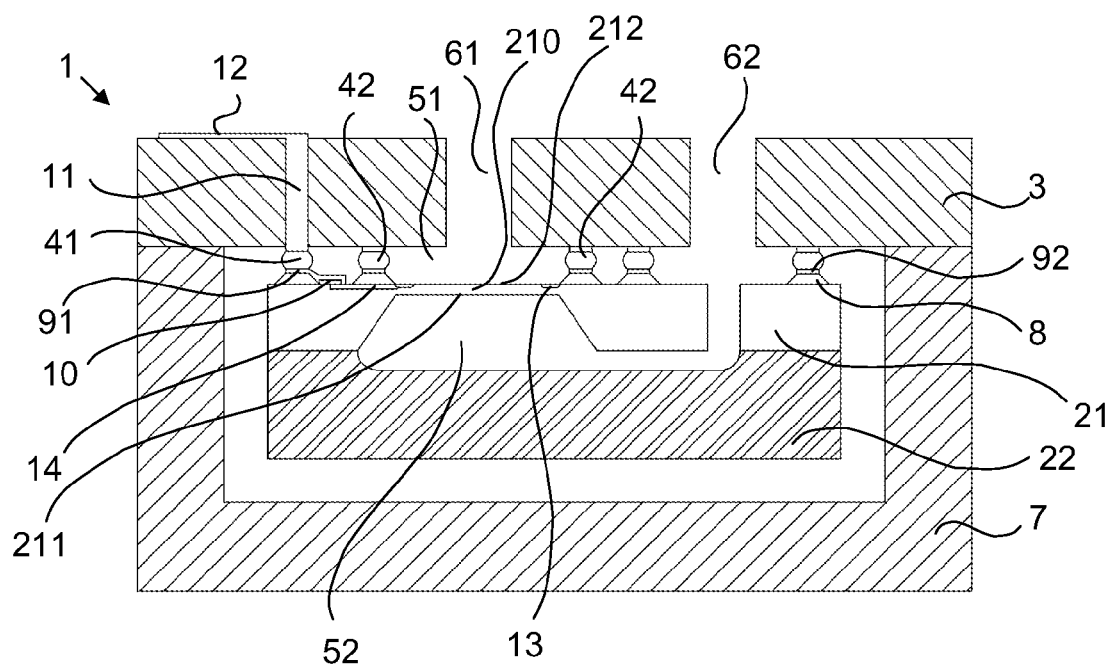
FIG. 3 shows a schematic sectioned view of a micromechanical measuring element according to a further exemplary embodiment.

FIG. 3 shows a sectioned view of a micromechanical measuring element 1 according to a further exemplary embodiment. The micromechanical measuring element 1 is realized as a relative or differential pressure sensor with media supplying means on one side at the front.

Contrary to the exemplary embodiment according to FIG. 1, the carrier 3 has a second opening 62 which serves for supplying a second medium. The second opening 62 extends through the carrier 3 and through a recess in the sensitive element 21, which, for example, can be generated by laser drilling, DRIE or KOH etching. As a result, the sensitive element 21 and the substrate 22 form a second chamber 52, a second medium being accessible to the bottom side 211 of the membrane 210 by the second opening 62. Consequently, in the exemplary embodiment shown in FIG. 3, the first medium is supplied to the top side 212 of the membrane 210, whilst, at chip level, a reference pressure is directed to the bottom side 211 of the membrane 210 by the second medium.

Figure 4:
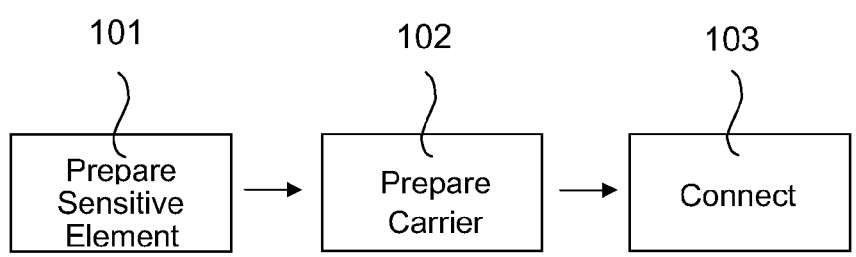
FIG. 4 shows a schematic representation of a method for producing a micromechanical measuring element according to a further exemplary embodiment.

FIG. 4 shows a schematic representation of a method for producing a micromechanical measuring element 1 according to one of the exemplary embodiments of FIGS. 1 to 3. The following references to features of the micromechanical measuring element consequently relate in a purely exemplary manner to the elements of FIGS. 1 to 3 using the references shown there.

A sensitive element 21 is prepared in a first method step 101. The sensitive element can be mounted on a substrate 22, for example. A carrier 3, which has at least one first opening 61 and at least one feedthrough 11, is prepared in a second method step 102. The sensitive element 21 is connected to the carrier 3 by solder connections 41, 42 in a third method step 103. The connecting of the sensitive element 21 to the carrier 3, in this case, is realized in one single process step, where the sensitive element 21 is contacted electrically and media is supplied to the sensitive element 21 at the same time. As a result, in an advantageous manner, both the electric and fluidic supplying means are contacted at the front in one simultaneous process step.

The description by way of the exemplary embodiments does not restrict the invention to the same, but includes each new feature as well as each combination of features. This includes, in particular, each combination of features in the claims, even if said feature or said combination itself is not provided explicitly in the claims or exemplary embodiments.

The invention claimed is:

1. A micromechanical measuring element, comprising:
   a carrier;
   a sensitive element connected to the carrier by a first solder connection and a second solder connection, wherein the sensitive element is electrically contacted by the first solder connection;
   elastomer bodies arranged between the sensitive element and the first and second solder connections; and
   a metallization arranged between the elastomer body and the first solder connection, wherein the metallization has a meandering or helical shape, and
   wherein the sensitive element, the carrier and the second solder connection form a first chamber, the first chamber having a first opening.

2. The micromechanical measuring element according to claim 1,
   wherein the sensitive element comprises a membrane with a bottom side and a top side, and
   wherein the top side of the membrane is accessible to a first medium by the first opening.

3. The micromechanical measuring element according to claim 1, wherein the first opening is realized in the carrier.

4. The micromechanical measuring element according to claim 1, wherein the second solder connection is ring-shaped.

5. The micromechanical measuring element according to claim 1, wherein the first chamber is provided at least in part with a protective layer.

6. The micromechanical measuring element according to claim 5, wherein the protective layer comprises parylene.

7. The micromechanical measuring element according to claim 1,
wherein the sensitive element is connected directly to a substrate on a side that is remote from the carrier,
wherein a second chamber is formed at least in part by the sensitive element and the substrate, and
wherein the second chamber has a second opening that runs through the carrier and the sensitive element.

8. The micromechanical measuring element according to claim 7,
wherein the sensitive element comprises a membrane with a bottom side and a top side, and
wherein the top side of the membrane is accessible to a first medium by the first opening.

9. The micromechanical measuring element according to claim 8, wherein the bottom side of the membrane is accessible to a second medium by way of the second opening.

10. The micromechanical measuring element according to claim 1, wherein the measuring element comprises a pressure sensor.

11. The micromechanical measuring element according to claim 1, wherein the measuring element comprises a gas sensor.

12. The micromechanical measuring element according to claim 1, wherein the measuring element comprises an acceleration sensor.

13. A method for producing a micromechanical measuring element, the method comprising:
providing a sensitive element;
providing a carrier that has a first opening for supplying a medium and a feed through for electrically contacting the sensitive element;
providing elastomer bodies and arranging the elastomer bodies between the sensitive element and first and second solder connections; and
providing a metallization and arranging the metallization between the elastomer body and the first solder connection, wherein the metallization has a meandering or helical shape, and
connecting the sensitive element to the carrier, wherein the sensitive element is contacted electrically and media is supplied to the sensitive element in one process step by connecting the sensitive element to the carrier.

14. The method according to claim 13, wherein connecting the sensitive element to the carrier comprises connecting the sensitive element to the carrier by flip-chip soldering.

15. A micromechanical measuring element comprising:
a carrier;
a sensitive element connected to the carrier by a first solder connection and a second solder connection, wherein the sensitive element is electrically contacted by the first solder connection;
elastomer bodies arranged between the sensitive element and the first and second solder connections; and
a metallization arranged between an elastomer body and the first solder connection, wherein the metallization comprises a meandering or helical shape, wherein the metallization is configured to decouple the carrier and the sensitive element to ensure that mechanical or thermal stress is minimized, and wherein the sensitive element, the carrier and the second solder connection form a first chamber, the first chamber having a first opening.

* * * * *